United States Patent [19]

Plepys et al.

[11] Patent Number: 6,140,707
[45] Date of Patent: Oct. 31, 2000

[54] LAMINATED INTEGRATED CIRCUIT PACKAGE

[75] Inventors: Anthony R. Plepys; Paul M. Harvey, both of Austin, Tex.

[73] Assignee: 3M Innovative Properties Co., St. Paul, Minn.

[21] Appl. No.: 09/074,126

[22] Filed: May 7, 1998

[51] Int. Cl.⁷ .................................................. H01L 29/40
[52] U.S. Cl. ...................... 257/778; 257/738; 257/780; 257/668; 257/680; 257/683; 257/737; 257/747; 257/795; 257/779; 438/108; 438/612; 438/613
[58] Field of Search .................................. 257/778, 780, 257/783, 779, 668, 680, 683, 711, 737, 738, 747, 795; 438/108, 612, 613

[56] References Cited

U.S. PATENT DOCUMENTS

| | | | |
|---|---|---|---|
| 3,930,857 | 1/1976 | Bendz et al. ............................... | 96/36.2 |
| 4,604,644 | 8/1986 | Beckham et al. .......................... | 357/80 |
| 4,814,943 | 3/1989 | Okuaki ..................................... | 361/400 |
| 5,121,190 | 6/1992 | Hsiao et al. ............................... | 357/80 |
| 5,128,746 | 7/1992 | Pennisi et al. ............................. | 357/72 |
| 5,136,365 | 8/1992 | Pennisi et al. ............................. | 357/72 |
| 5,194,930 | 3/1993 | Papathomas et al. ..................... | 257/773 |
| 5,216,278 | 6/1993 | Lin et al. .................................. | 257/688 |
| 5,218,234 | 6/1993 | Thompson et al. ....................... | 257/787 |
| 5,227,008 | 7/1993 | Klun et al. ................................ | 156/630 |
| 5,261,155 | 11/1993 | Angulas et al. .......................... | 29/830 |
| 5,355,283 | 10/1994 | Marrs et al. .............................. | 361/760 |
| 5,357,673 | 10/1994 | Polak et al. ............................... | 29/840 |
| 5,371,404 | 12/1994 | Juskey et al. ............................. | 257/659 |
| 5,398,863 | 3/1995 | Grube et al. .............................. | 228/106 |
| 5,401,913 | 3/1995 | Gerber et al. ............................. | 174/264 |
| 5,436,503 | 7/1995 | Kunitomo et al. ........................ | 257/737 |
| 5,442,240 | 8/1995 | Mukerji .................................... | 257/783 |
| 5,450,283 | 9/1995 | Lin et al. .................................. | 361/704 |
| 5,489,749 | 2/1996 | DiStefano et al. ........................ | 174/261 |
| 5,536,909 | 7/1996 | DiStefano et al. ........................ | 174/261 |
| 5,550,408 | 8/1996 | Kunitomo et al. ........................ | 257/737 |
| 5,583,376 | 12/1996 | Sickler et al. ............................. | 257/702 |

(List continued on next page.)

FOREIGN PATENT DOCUMENTS

| | | | |
|---|---|---|---|
| 0797253A2 | 9/1997 | European Pat. Off. ...... | H01L 23/498 |
| 2 292 003 | 2/1996 | United Kingdom . | |
| WO 97/36325 | 10/1997 | WIPO .......................... | H01L 23/34 |

OTHER PUBLICATIONS

3M Electronic Products Division, "*Microflex TBGA Design Guide Addendum*," booklet (1997).

3M Electronic Products Division, "*Tech Paper Electrical Characterization of a Tape Ball Grid Array Package*," Tech Paper (1997).

3M Electronic Products Division, "*Reliability Results for a Microflex Wire Bondable Tape Ball Grid Array Package*," Tech Paper (1997).

*Primary Examiner*—Tom Thomas
*Assistant Examiner*—Luan Thai
*Attorney, Agent, or Firm*—Darla P. Fonseca

[57] ABSTRACT

A low-cost integrated circuit package is provided for packaging integrated circuits. In preferred embodiments, the package comprises a flexible circuit that is laminated to a stiffener using a dielectric adhesive, with the conductive traces on the flexible circuit facing toward the stiffener but separated therefrom by the adhesive. The conductive traces include an array of flip-chip attachment pads. A window is formed in the stiffener over the attachment pad array, such as by etching. The adhesive is then removed over the attachment pads by laser ablation, but left in place between the pads, thus forming a flip-chip attachment site. In preferred embodiments, this invention eliminates the need for high-resolution patterned adhesive, and it also eliminates the need for application of a solder mask at the flip-chip attachment site, because the remaining adhesive performs the solder mask function of preventing bridging between attachment pads. This package provides a die attachment site having a high degree of planarity due to tensile stresses formed in the flexible circuit and adhesive layers during lamination of those layers to the stiffener. Embodiments of this invention may be used with TBGA, frangible lead, and other packaging technologies.

6 Claims, 5 Drawing Sheets

U.S. PATENT DOCUMENTS

| | | | |
|---|---|---|---|
| 5,583,378 | 12/1996 | Marrs et al. | 257/710 |
| 5,601,678 | 2/1997 | Gerber et al. | 156/150 |
| 5,647,123 | 7/1997 | Greenwood et al. | 29/840 |
| 5,650,593 | 7/1997 | McMillan et al. | 174/52.4 |
| 5,663,530 | 9/1997 | Schueller et al. | 174/260 |
| 5,686,703 | 11/1997 | Yamaguchi | 174/259 |
| 5,717,252 | 2/1998 | Nakashima et al. | 257/707 |
| 5,744,863 | 4/1998 | Culnane et al. | 257/712 |
| 5,801,449 | 9/1998 | Dehaine et al. | 257/780 |

LAMINATED INTEGRATED CIRCUIT PACKAGE

FIELD OF THE INVENTION

This invention relates to the field of semiconductor packaging technology. In particular, it provides an improved chip carrier that is useful in tape ball grid array (TBGA) packaging technology for solder bump or flip-chip integrated circuits.

BACKGROUND OF THE INVENTION

The size of semiconductor integrated circuits (also referred to herein as "die" or "chips") continuously decreases, resulting in demand for interconnect and packaging technologies that accommodate the increasingly high interconnect densities. Anticipated interconnect densities that will be employed on chips in the near future will require advances in packaging technology in order to connect such chips to other circuitry. In particular, integrated circuits that employ solder bumps and so-called "flip-chip" circuits comprise an array of contact pads on the active side of the chip that must be connected to other circuits. Typically, solder connections are formed between the contact pads on the integrated circuit and conductive elements on a carrier or package. The conductive elements on the carrier couple each contact pad to a selected site in the carrier structure. The purpose of the carrier is to make a transition from the very high density (and correspondingly small dimensions) of the chip contact pads to an arrangement of carrier contacts at a lower density. The carrier contacts may take the form of a ball grid array (BGA), which is well known in the art. The carrier can then be connected to a printed circuit board, for example, using standard methods known in the art. The carrier must also provide for dissipation of heat from the chip, which can be a substantial engineering requirement in many applications. The planarity and thermal stability of the carrier where the flip-chip is attached thereto are also important requirements that are more difficult to satisfy as chips become smaller and pad densities become higher.

Some known types of carriers comprise tape ball grid array (TBGA) technology. This technique employs a flexible tape having conductive traces formed thereon. Each trace extends from a point where a chip contact pad may be connected to it, for example by wire bonding or by flip-chip techniques, to a solder ball in a ball grid array. The TBGA carrier is typically attached by an adhesive to a relatively rigid stiffener, which provides some degree of planarity to the package. The chip may be connected for physical support to the tape or to the stiffener. The stiffener is often placed in contact with or near the chip in order to aid in removing heat from the chip. For wire bonding applications, a window may be formed in the center of the carrier tape, and the chip may reside within the window, such that the bond pads on the chip (which are typically around the edge of the chip in wire bond applications) are as close as possible to the conductive traces to which they are to be connected. U.S. Pat. No. 5,663,530 (incorporated herein by reference) describes a wire bond TBGA package in further detail. The invention of the '530 patent employs an insulating adhesive to insulate the conductive traces on a flexible circuit from a conductive stiffener when the traces are on the same side of the flexible circuit as the stiffener.

In some prior art flip-chip attachment processes, anisotropic adhesives have been employed. An example of such an adhesive is presented in U.S. Pat. 5,686,703 (incorporated herein by reference).

Figure 1:
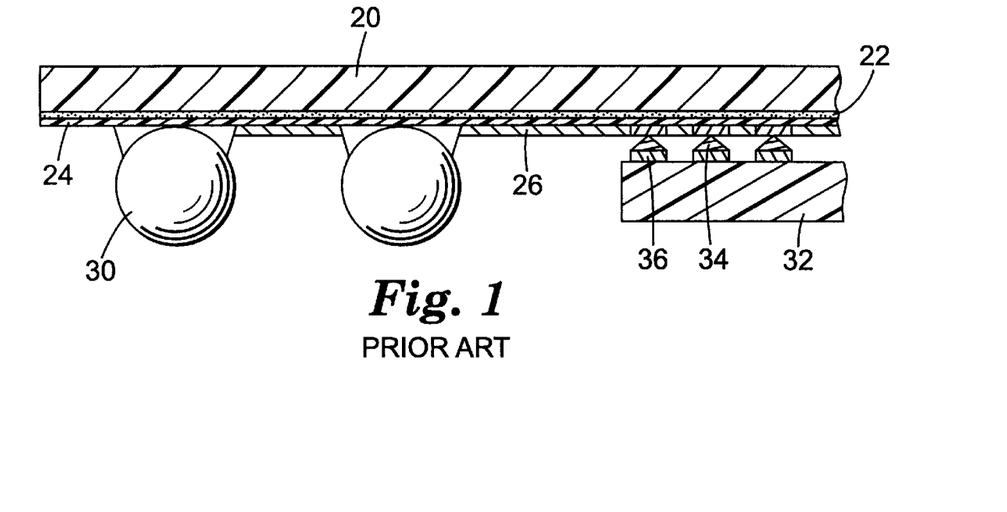
FIG. 1 is an elevation view of a prior art flip-chip/TBGA assembly.

U.S. Pat. No. 5,583,378 (incorporated herein by reference) describes both wire bond and flip-chip BGA arrangements in detail. In the flip-chip arrangements disclosed in the '378 patent, as illustrated in FIG. 1 of this specification, stiffener 20 is attached by a layer of adhesive 22 to one side of a flexible tape 24, and conductive traces 26, contact pads 28, and solder balls 30 are on the opposite side of tape 24 from stiffener 20. Integrated circuit chip 32 is attached to carrier contact pads 28 using flip-chip techniques, wherein a solder connection 34 is formed between carrier pads 28 and chip pads 36. Chip 32 may be positioned close enough to stiffener 28 for the stiffener to act as a heat sink in some applications, even though layers of insulating tape, adhesive and encapsulant may separate the chip from the stiffener.

A problem with this and other prior art flip-chip TBGA arrangements is that the chip 32 is necessarily on the same side of the tape (and of stiffener 20) as are the BGA balls 30, such that chip 32 is sandwiched between the carrier and the printed circuit board (PCB) when it is installed, thus precluding access to the chip for additional heat sinking if it is needed. This approach also requires the application of a high density, high precision solder mask in the area of the flip-chip attachment, which is a difficult and costly processing step. Finally, as tolerances shrink with chip size and chip interconnect density, it has become difficult to form flip-chip attachment contacts 28 on the carrier with adequate planarity. It will be recognized that if even one contact pad is sufficiently out of plane it can cause improper attachment and failure of the packaged device.

SUMMARY OF THE INVENTION

The present invention addresses deficiencies in the prior art to provide an integrated circuit chip carrier that is suitable for anticipated very high flip-chip contact densities. This invention provides a flip-chip package wherein the chip may be on top of the flexible circuit tape, so that it is accessible for thermal management or other purposes when the package is mounted on a PC board or other substrate. The carrier contact pads for the flip-chip connection are maintained in a coplanar arrangement by attaching a stiffener to the tape and forming a window in the stiffener. The window may be formed by etching the stiffener material. The chip may be attached to the flexible circuit that is exposed through the window. Furthermore, the costly solder mask operation is eliminated by using the adhesive layer between the stiffener and the tape as a dielectric to insulate the traces from the stiffener and to insulate the flip-chip contacts from one another. Vias may be formed in the adhesive layer, for example by laser ablation, at the locations of flip-chip contacts. Embodiments of the invention may also be employed where the integrated circuit die is located on top of the tape and the conductive traces are located on the bottom of the tape (so-called "circuit out" configuration). In this configuration, vias may be formed in the tape by laser ablation or other methods to expose the die attachment pads.

In preferred embodiments of the invention, the flexible circuit tape and the adhesive have higher coefficients of thermal expansion than the stiffener, so that after the circuit is laminated to the stiffener in a high temperature process, the tape and adhesive tend to shrink relative to the stiffener when the laminated assembly is cooled to room temperature, thus forming tension in the tape and adhesive materials. When the window is cut out of the stiffener as described herein, the tape and adhesive that span the window are in tension, thus providing a very high degree of planarity in the vicinity of the flip-chip connection, resulting in a connection having improved performance and reliability as compared to the prior art. The planarity of the flexible circuit in preferred embodiments of this invention may be better than 25 microns at the chip mounting locations and better than 6 mils at the board mounting locations.

The invention also eliminates the need for a fine pitch solder mask at the flip-chip die interface (where the circuit pattern is on the same side of the flexible tape as the integrated circuit) because the adhesive covers the upper side of the flexible circuit and may be selectively removed to provide access to the bonding pads on the flexible circuit, such as by laser ablation. The adhesive may be left in place between bonding pads to provide insulation and prevent solder bridging. In some embodiments, the die attachment pads may be raised with respect to the other conductive traces on the flexible circuitry, so that the adhesive may be removed uniformly in the window area (not patterned) in order to expose the raised pads while still covering the conductive traces. In such embodiments, the adhesive may be removed by a plasma or chemical etch process.

Various embodiments of the present invention, which is defined by the claims appended hereto, may be used in diverse applications. "Flip-chip" is just one example of a die connection technology that may be employed with this invention. Other connection methods, both presently known and later developed, may benefit from the present invention. Various types of flexible circuit materials and structures may be used in the invention. For example, multiple trace layer configurations may be used in the invention, including double metal designs and laminated multi-layer circuits.

In one aspect, the invention provides a packaging component for an integrated circuit chip comprising a layer of flexible dielectric tape having a selected pattern of conductive traces formed on a first side thereof, said conductive traces having die attachment pads and ball-grid-array attachment pads; openings formed in said tape exposing said ball-grid-array attachment pads on a second side of the tape; a layer of dielectric adhesive covering said first side of the tape and the conductive traces formed thereon; openings formed in said layer of dielectric adhesive exposing said die attachment pads; and a stiffener attached to the layer of dielectric adhesive, the stiffener having a window formed therein exposing said die attachment pads. In some embodiments, the invention may further include a plurality of solder balls disposed on the second side of the tape, the solder balls being attached to the ball-grid-array attachment pads through the openings formed in the tape; and an integrated circuit disposed within the window formed in the stiffener and operably attached to the die attachment pads.

In another aspect the invention provides a method for making a packaging component for an integrated circuit, comprising providing a flexible dielectric tape having a selected pattern of conductive traces formed thereon, said conductive traces having die attachment pads and ball-grid-array attachment pads; applying a layer of dielectric adhesive to a first side of the tape, covering the conductive traces and die attachment pads formed thereon; attaching a stiffener to the tape using the adhesive, such that the stiffener covers the tape and conductive traces formed thereon, and such that the stiffener is separated from the conductive traces by a thickness of dielectric adhesive; forming a window in said stiffener so as to expose a portion of the tape and adhesive where the die attachment pads are located; and removing adhesive overlying said die attachment pads so as to expose the die attachment pads, while leaving adhesive in place between the die attachment pads.

In preferred embodiments, the stiffener may be laminated to the tape by applying heat and pressure to the assembly of tape, adhesive and stiffener in order to laminate the tape to the stiffener, perhaps by heating the assembly to at least 500 degrees F. and applying pressure of at least 200 pounds per square inch.

In another aspect, the invention provides a packaging component for an integrated circuit chip comprising a layer of flexible dielectric tape having a selected pattern of conductive traces formed thereon; a layer of dielectric adhesive covering a first side of the tape and the conductive traces formed thereon; openings formed in said layer of dielectric adhesive exposing die attachment pads said adhesive being left in place between pads; and a stiffener attached to the layer of dielectric adhesive, the stiffener having a window formed therein exposing said die attachment pads.

In yet another aspect, the invention provides a packaging component for an integrated circuit chip comprising a layer of flexible dielectric tape having a selected pattern of conductive traces formed thereon; a layer of anisotropically conductive adhesive covering a first side of the tape and the conductive traces formed thereon; and a non-conductive stiffener attached to the layer of dielectric adhesive, the stiffener having a window formed therein exposing said adhesive in the area overlying the die attachment pads.

In another aspect, the invention provides a method for forming a package for a semiconductor die, comprising laminating a flexible circuit to a stiffener under elevated temperature and pressure using a dielectric adhesive, the flexible circuit having die attachment features; and then removing a portion of the stiffener proximate said die attachment features to form an orifice in the stiffener.

In another aspect, the invention provides a method of forming a package for a semiconductor device, comprising providing a laminated assembly including a flexible circuit, an adhesive layer, and a generally planar stiffener; and forming an orifice in the stiffener to expose the underlying adhesive layer.

The present invention is equally applicable for use in conjunction with numerous technologies for mounting the packaged die to a PC board or other substrate. These technologies include various types of ball grid array, pin grid array, and cantilevered or frangible lead approaches, which may involve conductive bonding methods such as soldering, thermal compression, ultrasonic compression, and others. For some attachment techniques, additional windows may be etched through the stiffener in order to provide access to mounting leads. Such windows may be patterned and etched through the stiffener simultaneously with formation of the die attachment window.

BRIEF DESCRIPTION OF THE DRAWINGS

So that the manner in which the herein described advantages and features of the present invention, as well as others which will become apparent, are attained and can be understood in detail, more particular description of the invention summarized above may be had by reference to the embodiments of the invention which are illustrated in the appended drawings. The drawings form a part of this specification.

It is noted, however, that the appended drawings illustrate only exemplary embodiments of the invention and are, therefore, not to be considered limiting of its scope, for the invention may admit to other equally effective embodiments.

Note that the figures are diagrammatic illustrations showing the relationships of the various components of the invention, and they are not intended to be to scale.

DETAILED DESCRIPTION OF PREFERRED EMBODIMENTS

Referring to FIGS. 2–5, in a preferred embodiment the present invention provides a TBGA chip carrier which is a component of an integrated circuit package that comprises a flexible BGA circuit 50 laminated to a stiffener 52. For the purposes of this discussion, the flexible circuit 50 will be referred to as being below stiffener 52, although this particular orientation is arbitrary. In use, an integrated circuit chip is mounted on top of flexible circuit 50 in window 54 that is formed in stiffener 52, and the flexible circuit may be connected by an array of solder connections to a PC board or other substrate, so as to connect the pads of the integrated circuit to conductive traces on the substrate via the conductive traces of the flexible circuit. An orifice or window 54 is provided in stiffener 52, exposing the top side of flexible circuit 50, so that the integrated circuit (IC) can be attached to the exposed die attachment pads 56 of the flexible circuit 50 using, for example, C4 flip-chip connection technology, which is well known in the art. Other technologies may be used with the present invention to connect the chip to the carrier, including technologies that may be developed in the future.

References in this patent to "flip-chip" technology are intended to identify methods for attaching an integrated circuit die having bonding pads on its active surface to conductive traces on a substrate, wherein the active surface of the die faces the substrate. Flip-chip connection methods typically involve the use of solder paste, solder balls or solder bumps to form conductive connections between the bonding pads 36 on the die 32 and corresponding attachment pads 28 on the substrate 20. Thermal compression and other non-solder-based connection technologies are also contemplated by the term "flip-chip" as it is used in this patent.

In typical solder bump or flip-chip IC connection processes, a solder mask is applied to the array of die attachment pads 56 on flexible circuit 50 to prevent solder bridging between the connections, which are very closely spaced and susceptible to bridging. In the present invention, no solder mask is required because adhesive layer 58 that is used to laminate flexible circuit 50 to stiffener 52 also serves to isolate the die attachment pads 56 (and the chip die pads) from one another, preventing solder bridging.

Figure 2:
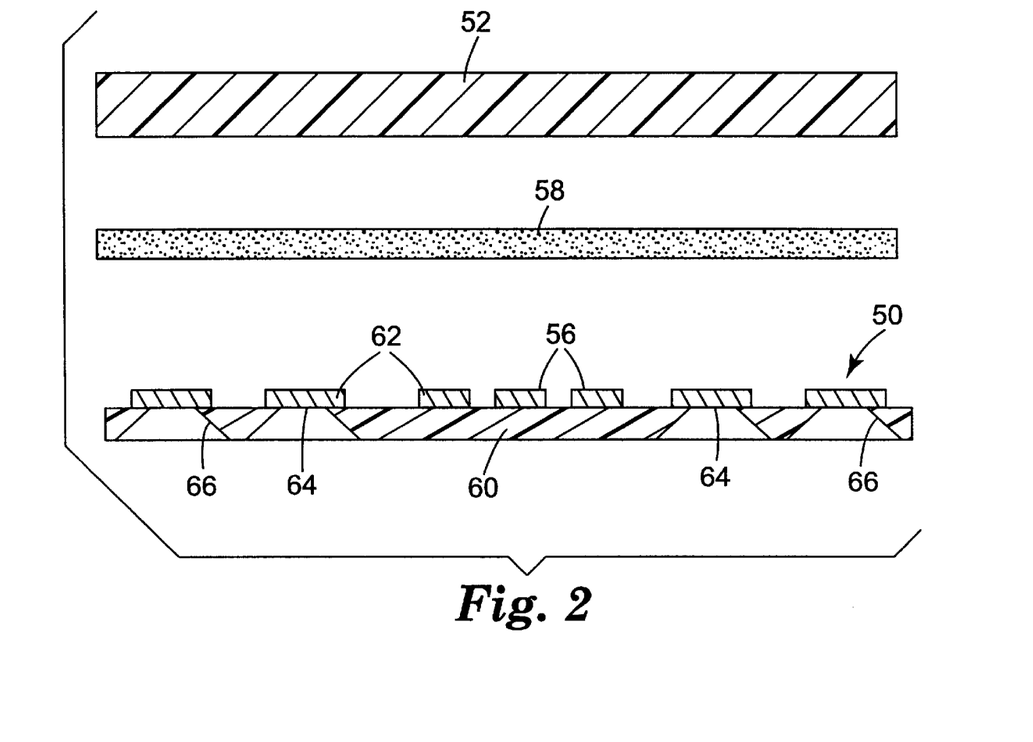
FIG. 2 is an exploded cross-sectional elevation view of the principal components of the present invention.

Referring to FIG. 2 in the illustrated preferred embodiment, the package component in accordance with the present invention comprises (i) a flexible circuit 50 including layer of flexible dielectric tape 60 having conductive traces 62 formed thereon, (ii) a layer of adhesive 58, and (iii) a stiffener 52. The conductive traces 62 include an array of carrier bond pads 56 on the top surface of the tape, and BGA solder ball pads 64 are also formed in circuit layer 62 and exposed on the bottom surface of tape 60 through vias 66 formed in the tape. Adhesive 58 is used to laminate stiffener 52 to tape 60. The adhesive may be non-conductive and serves to separate and insulate circuitry 62 from the stiffener, which may be conductive, as well as to securely attach the flexible circuit 50 to the stiffener.

An example of a dielectric tape 60 suitable for use in this invention is Kapton tape having a thickness of between 0.5 and 5 mils, which is manufactured and sold by DuPont. This tape is laser etchable, chemical and heat resistant, and functional as a solder mask. Other materials known in the art may also be used in this invention.

In presently preferred embodiments, the desired conductive circuitry pattern 62 may formed on the upper surface of the tape using standard lithographic techniques (additive or subtractive) that are well known in the art. In presently preferred embodiments, flexible circuit 50 may be made by first coating the tape with, for example, 15 to 35 microns of copper. The copper surface is then coated with photoresist, the resist is exposed using a mask to form the desired metallization pattern, and the resist is developed to uncover the portions of the copper layer that are to be removed. The copper is then removed by etching, and the remaining resist is stripped from the tape, leaving the desired pattern of copper conductors 62. (The tape materials may also be etched into a desired pattern.) The copper conductors may then be plated, if desired. In preferred embodiments, the copper may be plated with about 60 microinches of nickel followed by about 20 microinches of gold, in order to provide a suitable surface for making the flip-chip connection to the carrier die pads 56 formed on the conductors. The metallurgy of the flexible circuit conductors may be chosen in specific applications to accommodate the connection technology that is to be employed. Suitable flexible circuits for use in this invention are made and sold by Minnesota Mining and Manufacturing Company of St. Paul, Minn., as well as by IBM, Shinko, Ibiden, Nitto Denko, Nippon Mektron and Sheldahl. U.S. Pat. No. 5,227,008, which is owned by 3M and incorporated herein by reference, describes an exemplary process for making flexible circuits that may be used in the present invention.

BGA connection sites 64 may be formed on the bottom surface of tape 60 by forming holes in tape 60 to expose selected areas of conductive traces 62, such as by etching, milling, laser ablation or other methods known in the art.

After flexible circuit 50 is prepared as described above, it may be laminated to stiffener 52. Stiffener 52 may be made from a thin, planar material that has adequate stiffness to support the tape assembly with a specified degree of planarity, which is required in order to obtain a good flip-chip connection between the chip and the die attachment pads. The stiffener may be conductive or non-conductive, depending on the needs of a specific application. In presently preferred embodiments of the invention, stiffener 52 is made of nickel plated copper having a thickness of 15 to 35 microns. Other materials and dimensions may be selected for use in particular applications by persons skilled in the art.

The adhesive 58 that is employed to laminate flexible circuit 50 to stiffener 52 is preferably selected to have good dielectric properties and to be laser etchable, heat resistant, chemical resistant, solder resistant, and suitable for use as a solder mask. The adhesive should also have good adherence to the flexible circuit materials (both tape 60 and conductive traces 62) and to the selected stiffener material. A preferred adhesive for use in the disclosed embodiments is polyimide adhesive, an example of which is Kapton KJ, available from El DuPont de Nemours of Wilmington, Del. The chemical makeup of this adhesive is very similar to that of a polyimide circuit substrate used in many microflex-type circuits, so there is little danger of contamination to the microflex circuit or bond pads from ionic or diffusion effects. Other adhesives, including polyimides, polyimide blends, and epoxies, may also be suitable for use in accordance with this invention. A presently preferred embodiment employs a 50 micron layer of Kapton KJ adhesive between the flexible tape and the stiffener. The conductive traces 62 may rise about 25 microns above the surface of tape 60, so this amount of adhesive provides an insulating space filled with dielectric adhesive of about 25 microns between the traces and the stiffener. Of course, these dimensions are exemplary only and are not to be construed as limiting the invention as defined by the claims. In order to form a good, void-free seal between the tape and the stiffener, the adhesive may be cured under elevated temperatures and pressures.

EXAMPLE

Prototypes of the present invention were fabricated by placing flexible circuit 50, adhesive 58, and stiffener 52 into a press that was preheated to 400 degrees Fahrenheit. The temperature was then increased to 670 F. while 150 pounds per square inch (psi) was applied to the parts. At 670 F., the pressure was increased to 750 psi and held for 8 minutes, then cooled to 600 F. while maintaining pressure. The pressure was then reduced to 375 psi and the assembly was cooled to room temperature.

Figure 3:
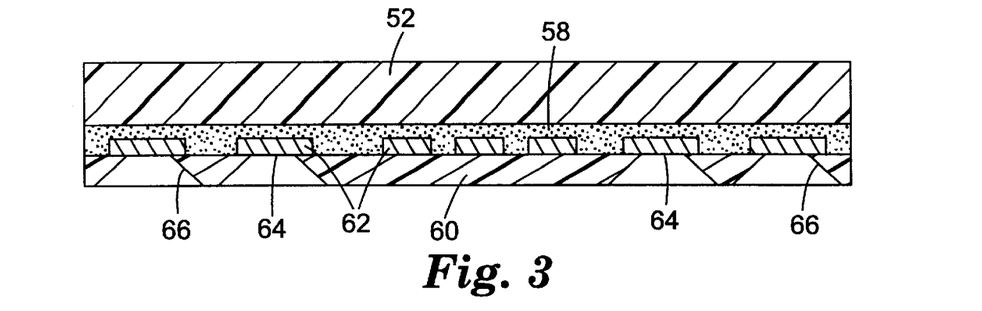
FIG. 3 is a cross-sectional elevation view of the principal components of the present invention prior to forming a window in the stiffener.

The specific procedure for effective, void-free lamination will be dependent upon the requirements of the adhesive selected for a particular application. One skilled in the art will envision other lamination processes within the scope of this invention after having received the benefit of this disclosure of the invention. For example, the laminated assemblies may be made by reducing the pressure to zero after the high temperature lamination, but the high temperature and pressure must typically be maintained for a longer period of time for a given adhesive. FIG. 3 illustrates the laminated assembly.

The described lamination process introduces tensile forces in the flexible tape and the adhesive layers of the laminated assembly. Those layers have higher coefficients of thermal expansion than does the stiffener, such that when the assembly is cooled the adhesive layer and the tape layer tend to shrink more than the stiffener, but are prevented from doing so because the layers are adhered to one another. The stiffener must be strong enough to prevent bending or warping of the assembly due to these tensile forces.

Figure 4:
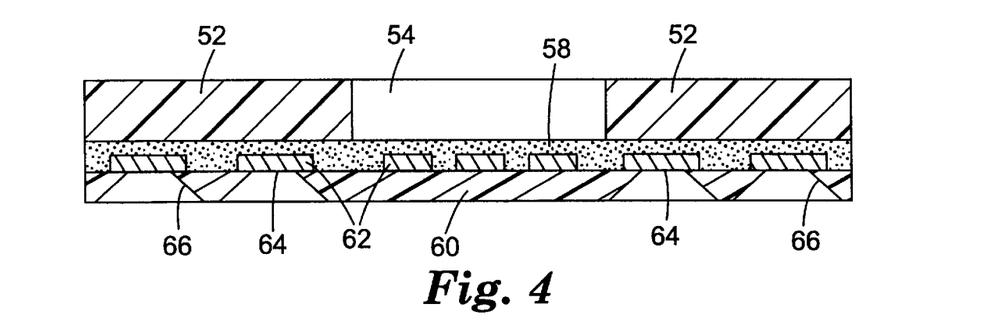
FIG. 4 shows the assembly of FIG. 3 after a window has been formed in the stiffener.

Referring to FIG. 4, the orifice or window 54 in stiffener 52 may be formed in the stiffener before lamination, or it may be formed after the lamination process is completed. In a presently preferred embodiment, window 54 is etched in stiffener 52 after the lamination process is completed. In this method, the laminated assembly is coated with photoresist (front and back). The area of the stiffener where the window is to be formed is exposed to light using a mask, and the photoresist is developed to remove it in the area of the window. (One skilled in the art will recognize that, alternatively, a negative resist may be used, wherein the window is masked and the remainder of the stiffener is exposed.) The assembly is then exposed to an etchant which etches the window through the stiffener where the photoresist has been removed. The remaining photoresist is then removed, such as by stripping. By way of example, a copper stiffener may be etched using a copper etchant bath of 2M HCL and cupric chloride at 130 degrees F. Suitable etchants are available for other stiffener materials, as will be known to those skilled in the art. Other etching chemistries and arrangements may be used, which are well known in the art. Once the stiffener is etched all the way through to the adhesive layer, the assembly is rinsed and the remaining resist is removed by a stripping process known in the art. The adhesive is preferably selected to be resistant to the etching and stripping chemistry. It is therefore substantially unaffected by the etch process, and it protects the underlying conductive traces of the flexible circuit during the etching process. Additional openings may be etched in the stiffener at the same time by appropriately patterning the photoresist. For example, if a frangible lead compression technique (see U.S. Pat. Nos. 5,489,749 and 5,536,909, which are incorporated by reference) is to be used to operably attach the chip carrier to a substrate, windows may be formed in the stiffener to provide access to the frangible leads.

In preferred embodiments, once the window is formed in stiffener 52, the remaining laminated adhesive/tape assembly in the window area is under tensile stress due to the stresses imposed during the lamination process. This stress has the beneficial effect of providing a high degree of planarity to the flexible circuit in the vicinity of the die bonding pads. It is generally desirable to achieve a degree of planarity with variations of no more than about 25 microns or 1 mil in order to provide a suitable die attachment site, although other tolerances may be suitable in selected applications.

In alternative embodiments of the present invention, the stiffener may be provided with a preformed window, and during the tape/stiffener lamination process a spacer or platen may be employed to fill the window space in order to ensure the planarity of the tape in the window region. Silicone or other suitable materials may be used for spacers in such an embodiment.

Figure 5:
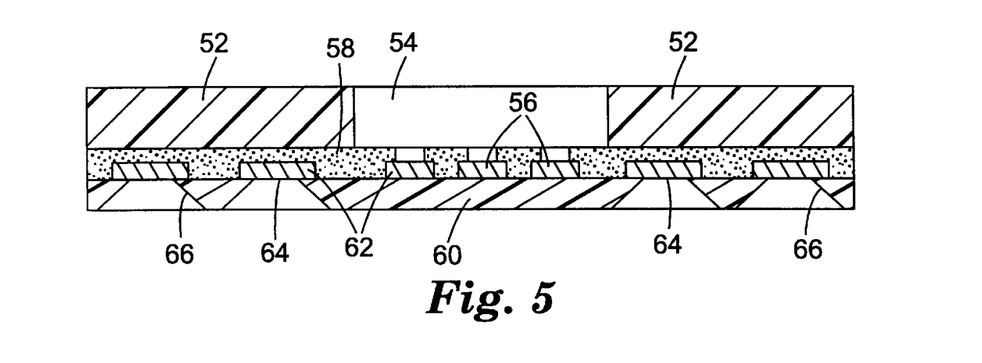
FIG. 5 shows the assembly of FIG. 4 after adhesive is removed to expose the die attachment pads.

Referring to FIG. 5, after window 54 is formed in stiffener 52, the adhesive 58 that covers the die attachment pad locations 56 on flexible circuit 50 may be removed to expose the metallic die attachment pad material at those locations. This may be performed, in preferred embodiments, using laser ablation techniques or other methods that are known in the art. After the adhesive over the die pads is removed, the assembly may be cleaned of residue, if necessary, such as by plasma processing.

In this way a flip-chip TBGA package may be formed that provides a suitably planar flexible circuit that has flip-chip connection pads on its upper surface and BGA connection sites on its lower surface. In embodiments where the conductive traces are on the upper surface of the flexible circuit, no solder mask layer is required on the top surface to prevent solder bridging, because the lamination adhesive performs the function of a solder mask as well as the function of a dielectric adhesive attaching the flexible circuit to the stiffener.

Figure 6:
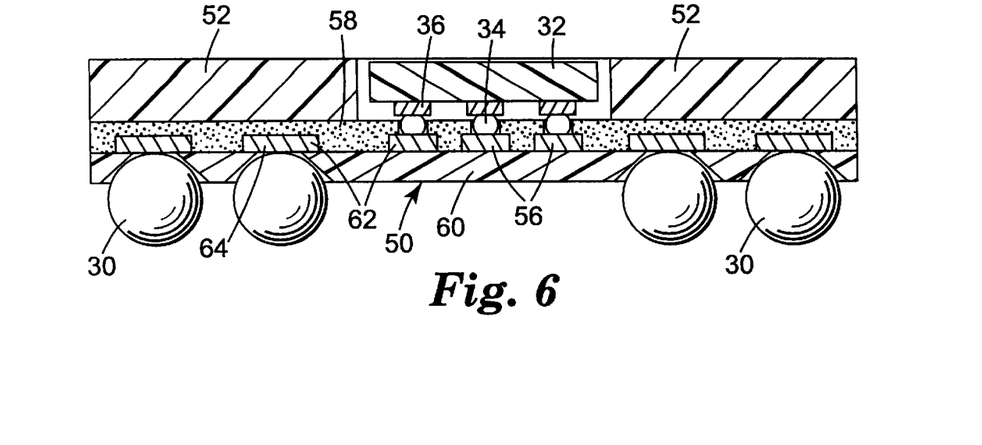
FIG. 6 is a cross-sectional elevation illustration showing an integrated circuit and BGA solder balls attached to a chip carrier according to the present invention.

Referring to FIG. 6, integrated circuit die 32 may be packaged using a chip carrier according to this invention by connecting bonding pads 36 on chip 32 to die attachment pads 56 formed by conductive traces 62 of flexible circuit 50, such as by solder 34. This may be done using flip-chip technology or other methods known in the art. Note that this invention eliminates the need for a high precision solder mask to be applied in the vicinity of die attachment pads 56, because the laminating adhesive performs the function of isolating the die attachment pads from one another and of preventing solder bridging between pads. BGA solder balls 30 may be attached to BGA attachment pads 64 through vias 66 using methods that are well known in the art.

To complete the package, an underfill material, such as an epoxy, may be inserted to fill any remaining space between die 32 and adhesive 58, and an encapsulant may be used to fill the spaces around the die and to cover the die to prevent moisture and other environmental elements from reaching the die. One advantage of a package constructed in accordance with this invention is that the non-active side of the integrated circuit die is made available facing outward from the PC board when it is installed, thus allowing a heat sink to be used in direct contact with the die or in close proximity to the die if needed.

While FIG. 6 is not drawn to scale, it shows that the density of the chip-to-tape connections is substantially greater than the density of the BGA solder ball array, which is used to connect the package of this invention to a printed circuit board. One of the purposes of the package is to make the transition from the high contact density of the integrated circuit die to the lower contact density of the printed circuit board. As will be recognized by persons skilled in the art, the conductive traces on the flexible circuit may be designed and manufactured to form the desired conductive connections between die attachment pads 56 and BGA solder balls 30. In an alternative embodiment of this invention, adhesive 58 may be an anisotropic conductive adhesive, which is conductive in the vertical direction but insulating in the horizontal direction (as illustrated). (See, for example, U.S. Pat. Nos. 5,686,703 and 5,143,785, which are owned by 3M and incorporated herein by reference.) This type of adhesive is structured such that when the adhesive is compressed under heat and pressure to form a bond, small conductive particles disbursed in the resin are trapped between the die pad and the contact pad and are compressed forming electrical contacts between the die pad and the contact pad. The adhesive cures, thereby trapping the particles in place. No metal reflow is required for such a bond and thus laminations can be formed at temperatures below the melting point of the interface metallurgy.

In such an embodiment it is not necessary to form holes in the adhesive 58 over die attachment pads 56, and no solder is required between chip 32 and the flexible circuit. Instead, chip 32 is aligned over die attachment pads 56 and secured in place by adhesive 58. The anisotropically conductive property of the adhesive operates to form connections between pads 36 on the chip and corresponding die attachment pads 56 on the flexible circuit, without forming conductive paths between adjacent pads. This technique avoids the need for an underfill because there is no space between chip 32 and adhesive 58. One skilled in the art will recognize that in this embodiment stiffener 52 must be non-conductive, or an insulating layer must be provided between the adhesive and stiffener 52 to prevent the formation of current paths between conductive traces 62 and stiffener 52.

FIGS. 7A through 7E illustrate an exemplary method for manufacturing a chip carrier according to the present invention wherein the die attachment pads are thicker and therefore stand higher above the flexible substrate than the remainder of the conductive circuitry on the substrate. This configuration provides several advantages that will be described.

Figure 7A:
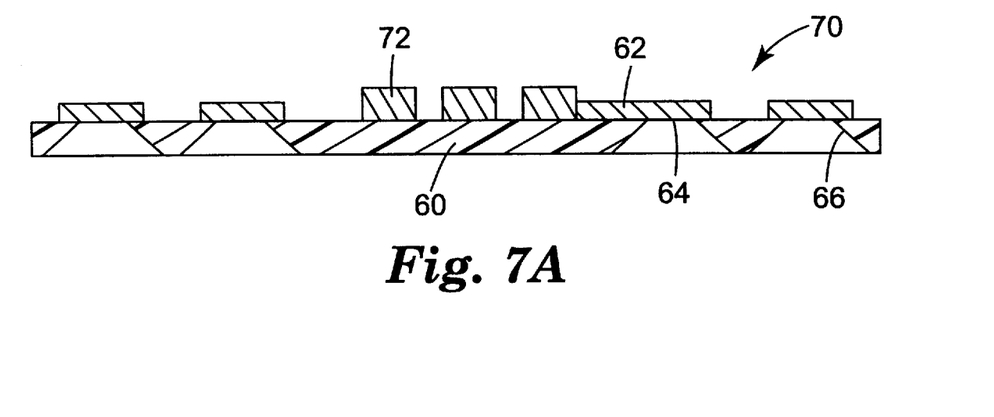
FIGS. 7A–7E are cross sectional illustrations of an embodiment of the invention in progressive stages of completion, for an embodiment that employs raised die attachment pads on the flexible circuit.

Referring to FIG. 7A, a flexible BGA circuit 70 is shown having a substrate 60, which may be polyimide tape, having conductive traces 62 formed thereon. Vias 66 may be formed in the tape to permit solder balls located on the bottom of the tape to be conductively connected to solder ball pads 64 formed in the conductive trace pattern 62. This flexible circuit may be formed using and materials as described elsewhere in this specification or as known in the art. In the illustrated embodiment, die attach pads 72 are formed to be thicker and to stand higher above substrate 60 than the other parts of conductive trace pattern 62. One method for forming the thicker pads is to form the conductive traces in an ordinary manner, and then to apply a patterned photoresist so as to expose only the die attach pads to an additional metallization process, such as, without limitation, electroplating or electroless plating. Another method for forming thicker pads is disclosed in U.S. Pat. No. 3,930,857, which is hereby incorporated into this patent by reference.

Figure 7B:
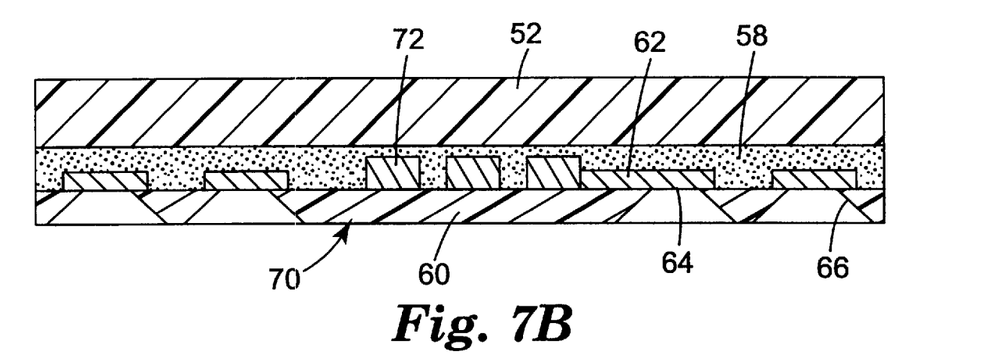
Figure 7C:
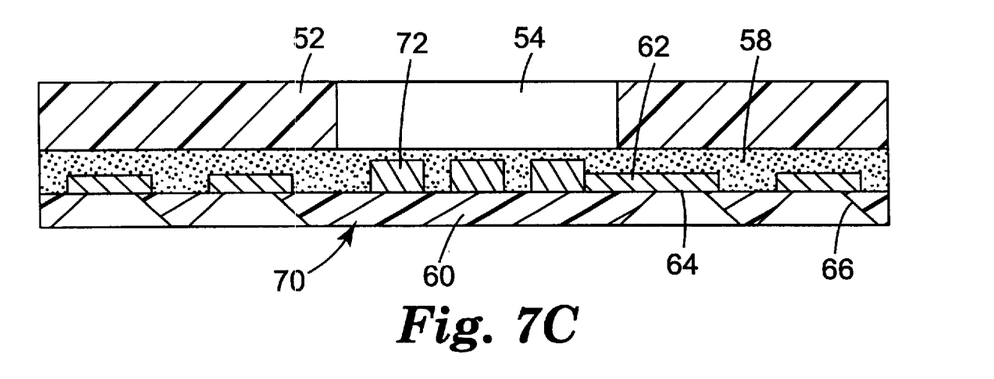
Figure 7D:
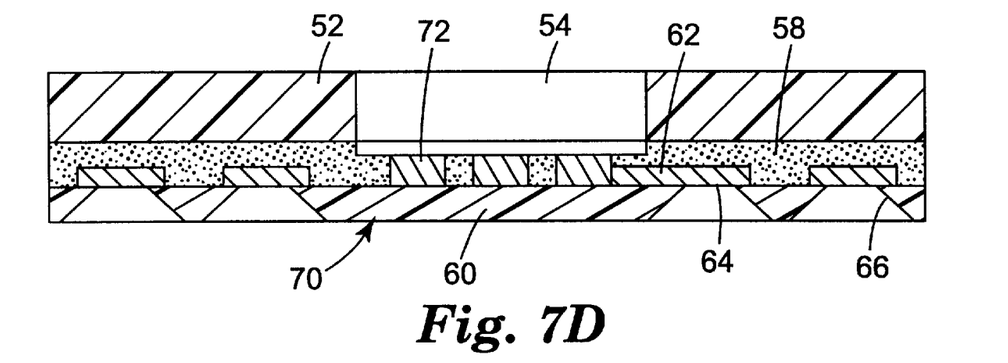
Figure 7E:
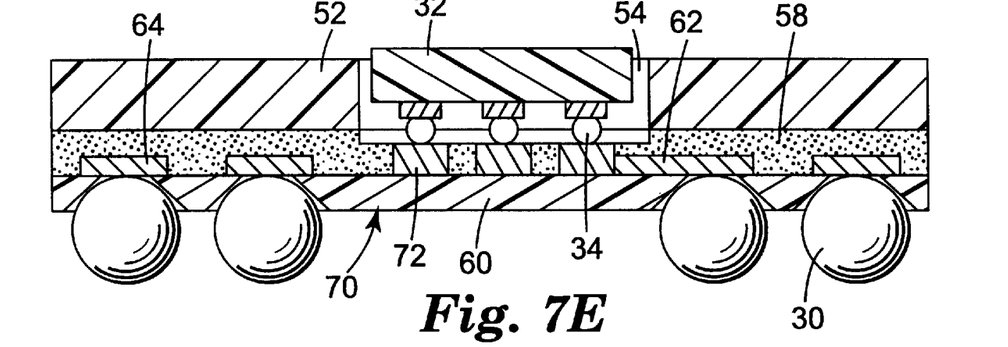

After the flexible circuit is formed as described in the preceding paragraph, it may be laminated to stiffener 52 using adhesive layer 58, as is shown in FIG. 7B and described above in connection with FIGS. 2 and 3. Window 54 may be formed in stiffener 52 to expose the region where the raised die attach pads 72 are located on the flexible circuit, as shown in FIG. 7C. Methods for forming the window are described above in connection with FIG. 4. Next, a portion of adhesive layer 58 may be uniformly removed from the area of window 54, such that the raised die attach pads become exposed, but the other conductive traces remain covered by adhesive 58. The adhesive may be removed by, for example, plasma etching using the stiffener 52 as a mask. Because the portions of the conductive traces 62 that are intended to be exposed (die attach pads 72) are raised, it is not necessary to selectively remove adhesive only over the pads as in previously described embodiments. This embodiment thus replaces a laser ablation or other high-precision adhesive removal step with a non-selective etching step because it is not necessary to pattern the adhesive. This operation provides the structure illustrated in FIG. 7D, with adhesive remaining in place between adjacent die attach pads 72 to prevent bridging of solder during reflow operations. Finally, FIG. 7E shows the resulting chip carrier structure with integrated circuit die 32 attached to die attach pads 72 by solder balls 34, as well as BGA solder balls 30 attached to BGA pads 64 through vias 66.

Figure 8:
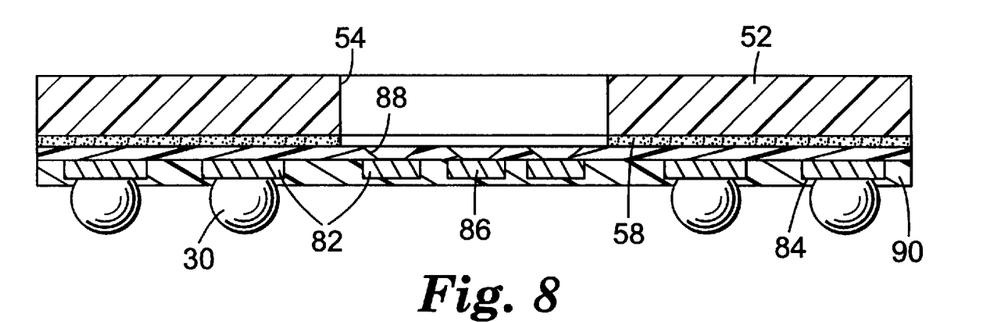
FIG. 8 is a cross-sectional illustration of an exemplary "circuit-out" embodiment of a chip carrier according to the present invention.

Referring to FIG. 8, an embodiment of a "circuit out" chip carrier constructed in accordance with the present invention will now be described. In this embodiment, the conductive traces are on the opposite side of the flexible substrate from the stiffener. In the illustration, conductive traces 82 are shown located on the bottom of flexible tape 60. The traces include solder ball pads 84 and die attach pads 86. Vias 88 are formed in flexible tape 60 so that an integrated circuit die may be attached to die attach pads 86 using flip-chip methods. The vias may be formed by laser ablation, patterned etching, or other techniques known in the art. A solder mask layer 90 is applied to the bottom of the flexible circuit to cover the conductive traces and to separate the solder ball pads 84 from each other to prevent bridging of solder during a reflow operation. The pitch of the solder ball pads 84 is substantially greater than that of the die attach pads 86, so that a patterned solder mask may be applied using conventional methods.

During manufacture of a chip carrier as shown in FIG. 8, stiffener 52 may be laminated to flexible circuit substrate 60 using adhesive 58, and window 54 may subsequently be formed in stiffener 52, using the methods discussed above.

Adhesive 58 may be fully or partially removed in the area of window 54, or alternatively it may be left in place. Vias 808 may be formed to penetrate substrate 60 as well as any remaining adhesive 58.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements may be substituted for those illustrated and described herein, and certain features of the invention may be utilized independently of the use of other features, all as would be apparent to one skilled in the art after having the benefit of this description of the invention.

We claim:

1. A packaging component for an integrated circuit die comprising:
    a layer of flexible dielectric tape having a selected pattern of conductive traces formed on a first side thereof, said conductive traces having die attachment pads and ball-grid-array attachment pads formed on said first side of said tape;
    openings formed in said tape exposing said ball-grid-array attachment pads from a second side of said tape;
    a continuous layer of dielectric adhesive covering said first side of the tape and the conductive traces formed thereon;
    openings formed in said layer of dielectric adhesive exposing said die attachment pads; and
    a stiffener attached to the layer of dielectric adhesive, the stiffener having a window formed therein exposing said die attachment pads, wherein said dielectric adhesive has a coefficient of thermal expansion higher than said dielectric tape and said stiffener, thereby creating tension in said window of said stiffener.

2. The article of claim 1, wherein the adhesive layer comprises polyimide adhesive.

3. The article of claim 1, wherein the flexible tape comprises polyimide tape.

4. The article of claim 1, wherein the die attachment pads extend farther from the flexible dielectric tape than do the other conductive traces.

5. A packaged integrated circuit, comprising the packaging component of claim 1, and further comprising:
    a plurality of solder balls disposed on the second side of the tape, the solder balls being attached to the ball-grid-array attachment pads through the openings formed in the tape; and
    an integrated circuit die disposed within the window formed in the stiffener and operably attached to the die attachment pads.

6. The packaged integrated circuit of claim 5, wherein the integrated circuit die is attached to the die attachment pads using flip-chip technology.

* * * * *